(12) United States Patent
Chiu et al.

(10) Patent No.: US 10,378,836 B2
(45) Date of Patent: Aug. 13, 2019

(54) WATER-COOLING RADIATOR ASSEMBLY

(71) Applicant: ASIA VITAL COMPONENTS CO., LTD., New Taipei (TW)

(72) Inventors: Jung-Yi Chiu, New Taipei (TW); Fu-Kuei Chang, New Taipei (TW)

(73) Assignee: ASIA VITAL COMPONENTS CO., LTD., New Taipei (TW)

(*) Notice: Subject to any disclaimer, the term of this patent is extended or adjusted under 35 U.S.C. 154(b) by 2 days.

(21) Appl. No.: 15/275,496

(22) Filed: Sep. 26, 2016

(65) Prior Publication Data
US 2018/0092246 A1 Mar. 29, 2018

(51) Int. Cl.
| | |
|---|---|
| *F28D 15/00* | (2006.01) |
| *F28F 7/00* | (2006.01) |
| *F28F 13/06* | (2006.01) |
| *F28F 1/24* | (2006.01) |
| *F28D 1/047* | (2006.01) |
| *F28D 1/02* | (2006.01) |
| *H01L 23/367* | (2006.01) |
| *H01L 23/473* | (2006.01) |
| *H01L 23/373* | (2006.01) |

(52) U.S. Cl.
CPC .............. *F28F 13/06* (2013.01); *F28D 1/024* (2013.01); *F28D 1/0472* (2013.01); *F28F 1/24* (2013.01); *H01L 23/3672* (2013.01); *H01L 23/473* (2013.01); *F28F 2250/08* (2013.01); *H01L 23/3736* (2013.01)

(58) Field of Classification Search
CPC . H01L 23/4735; H01L 23/473; H01L 23/467; F28D 2021/0029; F28D 1/0472; H05K 7/20345; H05K 7/20309

USPC .................................... 165/80.4, 104.21
See application file for complete search history.

(56) References Cited

U.S. PATENT DOCUMENTS

| | | | | |
|---|---|---|---|---|
| 6,575,231 | B1* | 6/2003 | Wu | H01L 23/467 165/121 |
| 2002/0135979 | A1* | 9/2002 | Estes | F28D 15/0233 361/688 |
| 2002/0144809 | A1* | 10/2002 | Siu | B21D 53/04 165/185 |
| 2006/0162900 | A1* | 7/2006 | Huang | H01L 23/467 165/80.4 |
| 2007/0125528 | A1* | 6/2007 | Fakheri | F28D 1/024 165/163 |

(Continued)

*Primary Examiner* — Jason N Thompson
(74) *Attorney, Agent, or Firm* — Jackson IPG PLLC; Demian K. Jackson (57) ABSTRACT

A water-cooling radiator assembly includes at least one first and one second sealing element and a water-cooling radiator main body formed of a plurality of stacked radiator elements. The second sealing element, the radiator elements and the first sealing element are sequentially stacked from bottom to top and integrally connected through heat treating to form the water-cooling radiator assembly. The first and second sealing elements have one side connected to an upper and a lower side, respectively, of the water-cooling radiator main body to seal a top and a bottom of a helical flow passage in the water-cooling radiator main body. A first and a second coupling section are optionally provided on the first and the second sealing element, respectively, or at a first and a second end of the helical flow passage, respectively; and the first and second coupling sections are fluidly communicable with the helical flow passage.

5 Claims, 10 Drawing Sheets

(56) References Cited

U.S. PATENT DOCUMENTS

| | | | | |
|---|---|---|---|---|
| 2008/0117637 A1* | 5/2008 | Chang | ............... | F28D 15/0266 |
| | | | | 362/294 |
| 2010/0051232 A1* | 3/2010 | Zhao | ............... | H01L 23/427 |
| | | | | 165/80.3 |
| 2011/0030920 A1* | 2/2011 | Qin | ............... | F21K 9/00 |
| | | | | 165/80.3 |
| 2017/0045313 A1* | 2/2017 | Fennessy | ............... | F28F 13/18 |

\* cited by examiner

WATER-COOLING RADIATOR ASSEMBLY

FIELD OF THE INVENTION

The present invention relates to a water-cooling radiator assembly, and more particularly, to a water-cooling radiator assembly that provides improved heat dissipation effect.

BACKGROUND OF THE INVENTION

With the rapid development and the expanded applications of many products from high-tech industries, such as computer and information industries, the currently available computer devices now have constantly increasing data processing speed. Presently, the electronic elements for use in computer devices are gradually miniaturized, and more integrated circuits (ICs) can be provided within one unit area than before. As a result, the heat produced by the internal electronic elements per unit area also increased. The large quantity of heat produced by the electronic elements must be timely removed from the computer devices to avoid damaged electronic elements and failed computer devices.

Figure 1:
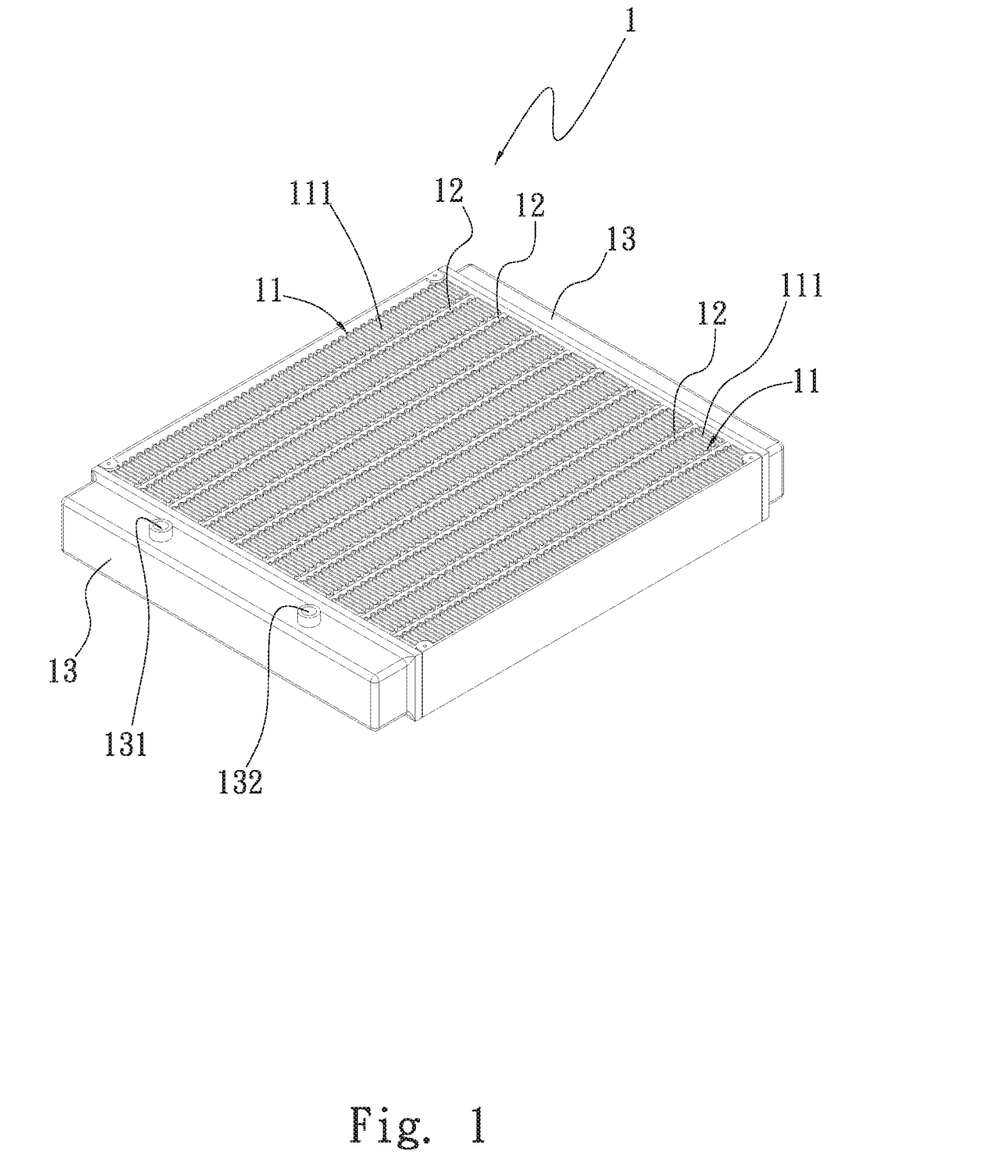
FIG. 1 is an assembled perspective view of a conventional water-cooling radiator.

To lower the working temperature of the heat-producing electronic elements, a water-cooling device has been introduced into the market. The water-cooling device includes a water-cooling radiator, which is connected to a pump and a water block via two tubes. The pump drives a water-cooling liquid, or a working fluid, to flow to the water-cooling radiator, so that heat carried by the water-cooling liquid is transferred to and dissipated from the water-cooling radiator into ambient environment. The pump drives the water-cooling liquid to continuously circulate between the water-cooling radiator and the water block to enable quick removal of heat from the heat-producing electronic elements. FIG. 1 shows a conventional water-cooling radiator 1, which is mainly assembled from three independent parts, namely, a plurality of serpentine radiating fins 11, a plurality of flat pipes 12 and two side water tanks 13. The serpentine radiating fins 11 are arranged between any two adjacent flat pipes 12 and are connected at outer sides of all turning points thereof to outer surfaces of corresponding flat pipes 12 by way of soldering to form a subassembly. Therefore, the flat pipes 12 are in only point contact with the serpentine radiating fines 11. The two side water tanks 13 are also soldered to two opposite sides of the subassembly of the radiating fins 11 and the flat pipes 12, so that the two side water tanks 43 are connected to the radiating fins 11 and the flat pipes 12 to form the water-cooling radiator 1. One of the two side water tanks 13 is provided with a water inlet 131 and a water outlet 132. The above mentioned two tubes (not shown) are respectively connected at one end to the water inlet 131 and the water outlet 132 on the water-cooling radiator 1.

The conventional water-cooling radiator 1 achieves the heat-dissipation effect because the heat carried by the working fluid flowing through the flat pipes 12 is transferred to the radiating fins 11, from where the heat is radiated into ambient environment. However, the conventional water-cooling radiator 1 has a problem of poor efficiency of heat transfer from the working fluid to the radiating fins 11. This is because the radiating fins 11 and the flat tubes 12 are two independent parts. While the radiating fins 11 are connected to the flat pipes 12 by soldering, the radiating fins 11 are not an integral part of the flat pipes 12. Therefore, thermal resistance occurs when the heat carried by the working fluid is transferred from the flat pipes 12 to the radiating fins 11 to cause lowered heat transfer efficiency, which in turn results in lowered cooling performance or lowered heat exchange efficiency of the whole water-cooling radiator 1. Further, since the serpentine radiating fins 11 are soldered at the outer sides of the turning points thereof to the outer surfaces of the flat pipes 12, the radiating fins 11 respectively have a structurally relatively weak middle section 111, which tends to become damaged or deformed when being subjected to an external force. Further, the effect of heat transfer from the flat pipes 12 to the radiating fins 11 is also relatively poor.

Moreover, since the conventional water-cooling radiator 1 is assembled from three independent parts, it not only involves complicated assembling processes that require considerably high time and labor cost, but also has the risk of leakage.

SUMMARY OF THE INVENTION

To solve the problems in the prior art water-cooling radiator, a primary object of the present invention is to provide a water-cooling radiator assembly that provides improved cooling effect.

Another object of the present invention is to provide a water-cooling radiator assembly that has upgraded heat transfer efficiency and includes fins with increased structural strength.

A further object of the present invention is to provide a water-cooling radiator assembly that includes a helical flow passage, so that the time over which a working fluid flows through the water-cooling radiator assembly along the helical flow passage is lengthened to enable even better heat dissipation effect.

To achieve the above and other objects, the water-cooling radiator assembly according to an embodiment of the present invention includes at least one first sealing element, at least one second sealing element and a plurality of radiator elements. The radiator elements are stacked to form a water-cooling radiator main body, and each of the radiator elements is provided at a specific position with a slot, which penetrates the radiator element in a thickness direction thereof, such that the slots of the stacked radiator elements together define a helical flow passage in the water-cooling radiator main body. The first and the second sealing element have one side connected to an upper and a lower side, respectively, of the water-cooling radiator main body to seal a top and a bottom, respectively, of the helical flow passage. A first coupling section is optionally provided on the first sealing element or at a first end of the helical flow passage, and a second coupling section is optionally provided on the second sealing element or at a second end of the helical flow passage, and the first and the second coupling section are fluidly communicable with the helical flow passage. With these arrangements, the water-cooling radiator assembly of the present invention can be manufactured at reduced cost while providing improved cooling effect and having fins with effectively increased structural strength.

According to an operable embodiment of the present invention, each of the radiator elements has a plurality of fins, which are outward extended from an outer periphery of the radiator element, and the slot of each radiator element is located and extended on a specific part of the fins.

According to an operable embodiment of the present invention, the first sealing element has a first sealing section and a plurality of first radiating fins. The first radiating fins are outward extended from an outer periphery of the first sealing element, and the first sealing section is located and extended on a specific part of the first radiating fins. Further, the first sealing section has one side connected to the upper side of the water-cooling radiator main body to seal the top of the helical flow passage.

According to an operable embodiment of the present invention, the second sealing element has a second sealing section and a plurality of second radiating fins. The second radiating fins are outward extended from an outer periphery of the second sealing element, and the second sealing section is located and extended on a specific part of the second radiating fins. Further, the second sealing section has one side connected to the lower side of the water-cooling radiator main body to seal the bottom of the helical flow passage.

According to an operable embodiment of the present invention, the first and the second sealing element are sheet members made of a metal material, and the radiator elements are sheet members made of a metal material; and the second sealing element, the radiator elements and the first sealing element are sequentially stacked from bottom to top and then integrally connected together through heat treating to form the water-cooling radiator assembly.

According to an operable embodiment of the present invention, the helical flow passage can be a tapered helical structure or a non-tapered helical structure.

According to an operable embodiment of the present invention, each of the first radiating fins further includes an extended fin section, which is upward extended from a radially outer end of the radiating fin; and the extended fin sections together define a receiving space for receiving a fan therein.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof and by referring to the accompanying drawings. For the purpose of easy to understand, elements that are the same in the preferred embodiments are denoted by the same reference numerals.

Figure 2:
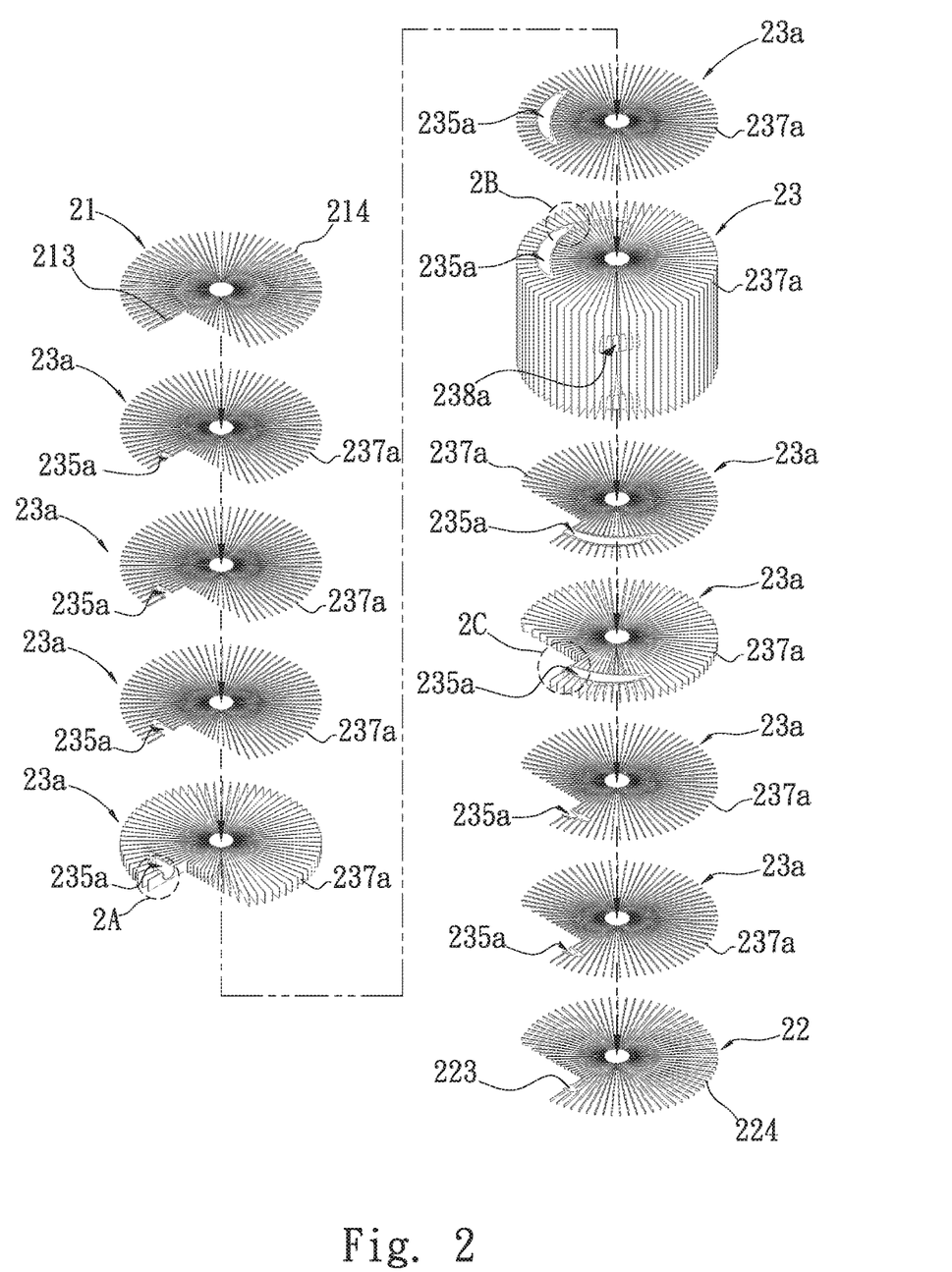
FIG. 2 is an exploded perspective view of a water-cooling radiator assembly according to an embodiment of the present invention.
Figures 2A, 2B:
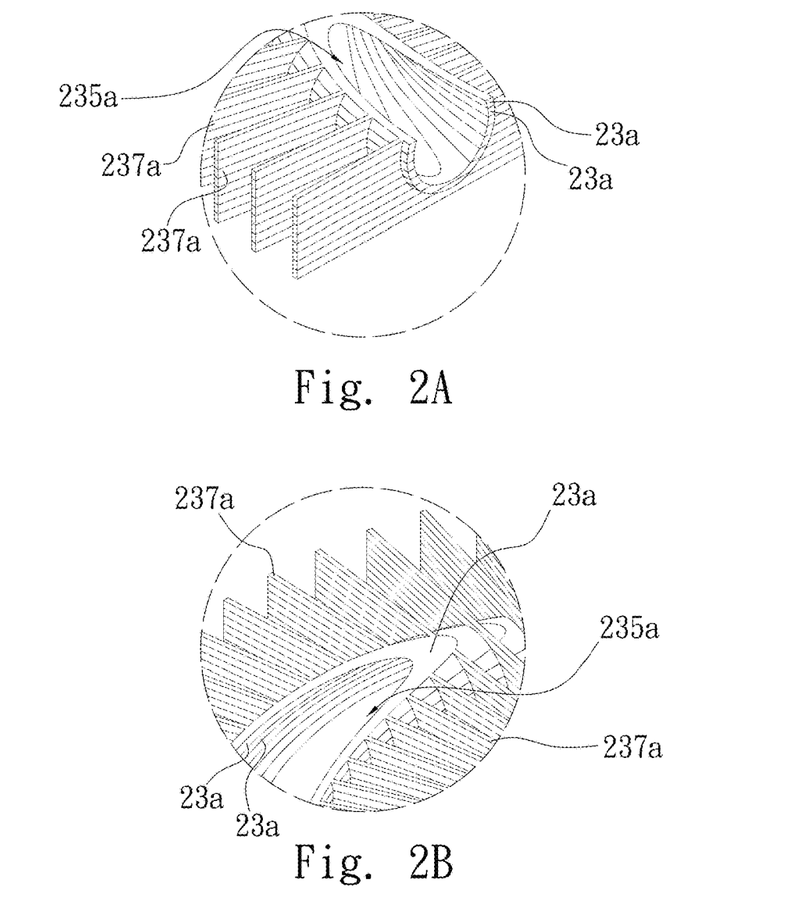
FIG. 2A is an enlarged view of the circled area 2A of FIG. 2.
FIG. 2B is an enlarged view of the circled area 2B of FIG. 2.
Figure 2C:
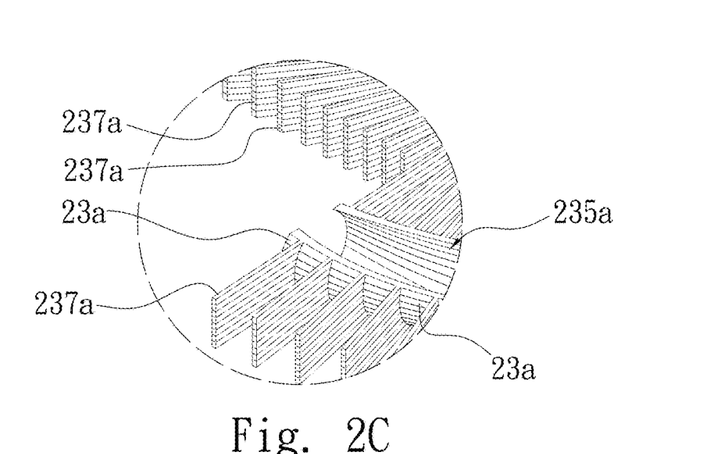
FIG. 2C is an enlarged view of the circled area 2C of FIG. 2.
Figure 3A:
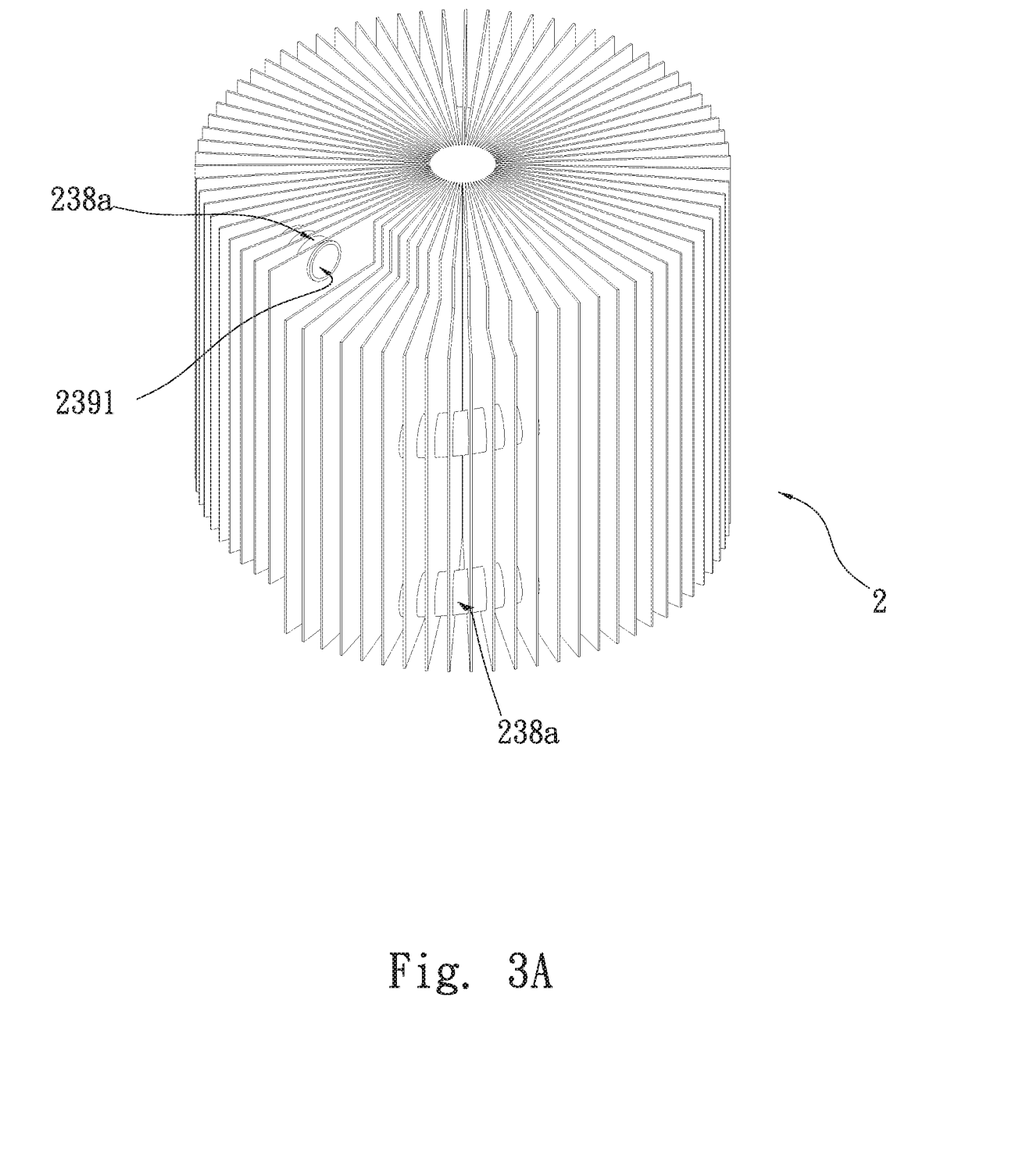
FIG. 3A is an assembled top perspective view of FIG. 2.
Figure 3B:
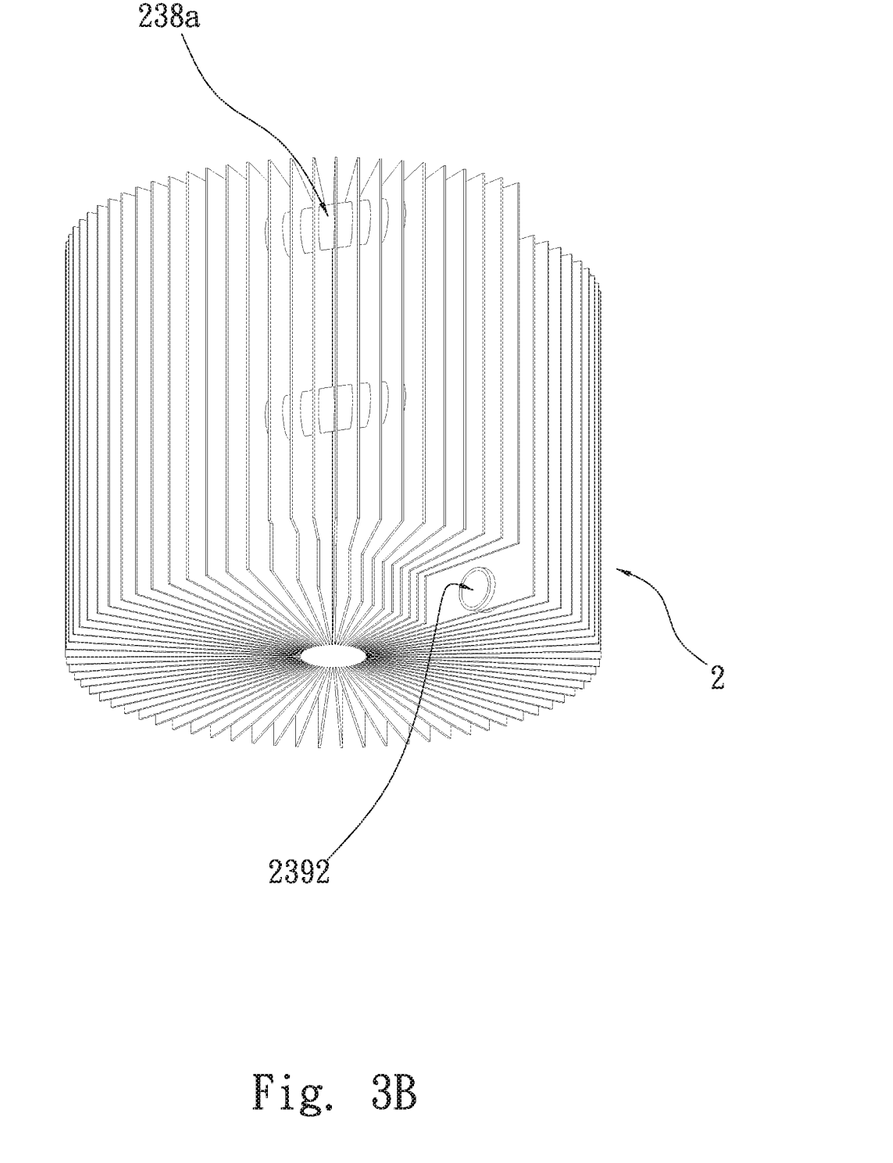
FIG. 3B is an assembled bottom perspective view of FIG. 2.
Figure 4A:
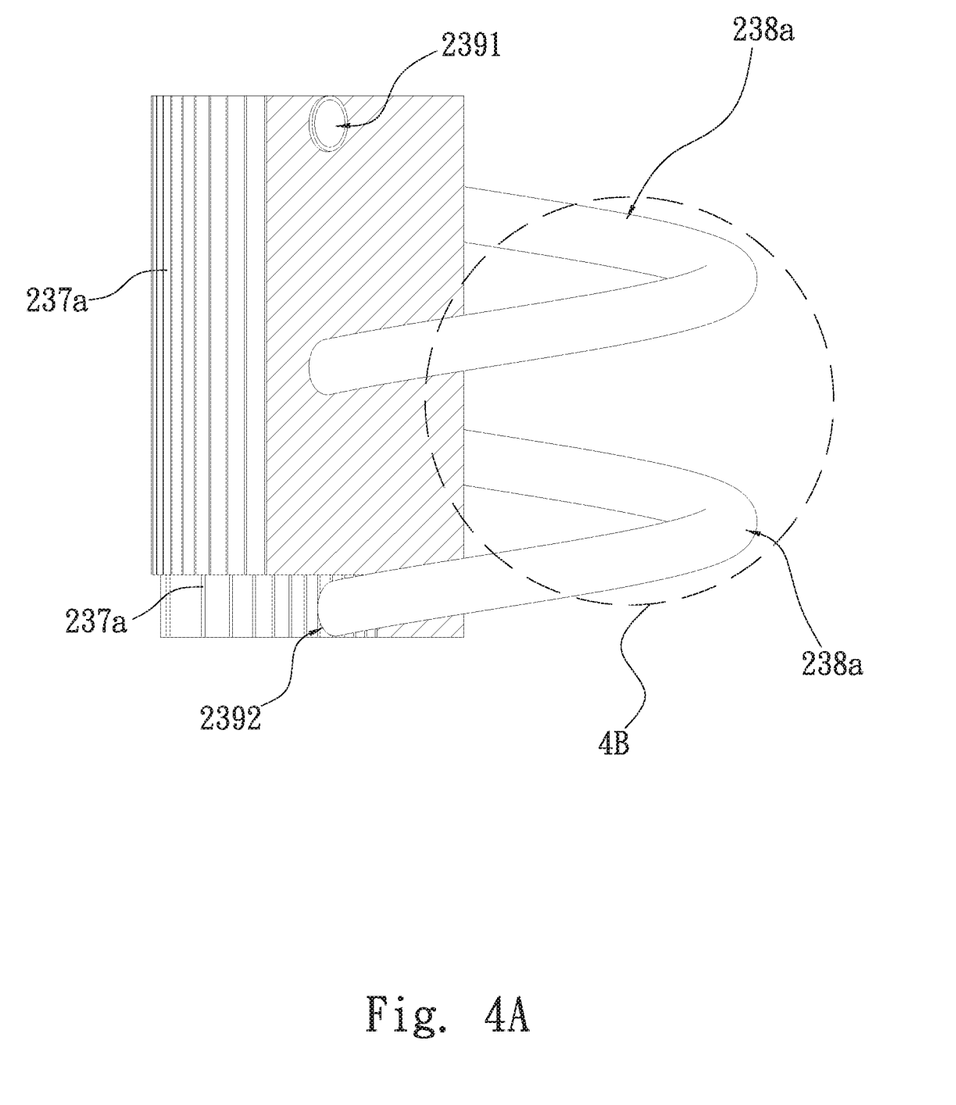
FIG. 4A is a partially sectioned perspective view of a water-cooling radiator main body of the water-cooling radiator assembly according to the present invention, illustrating a helical flow passage formed thereon.
Figure 4B:
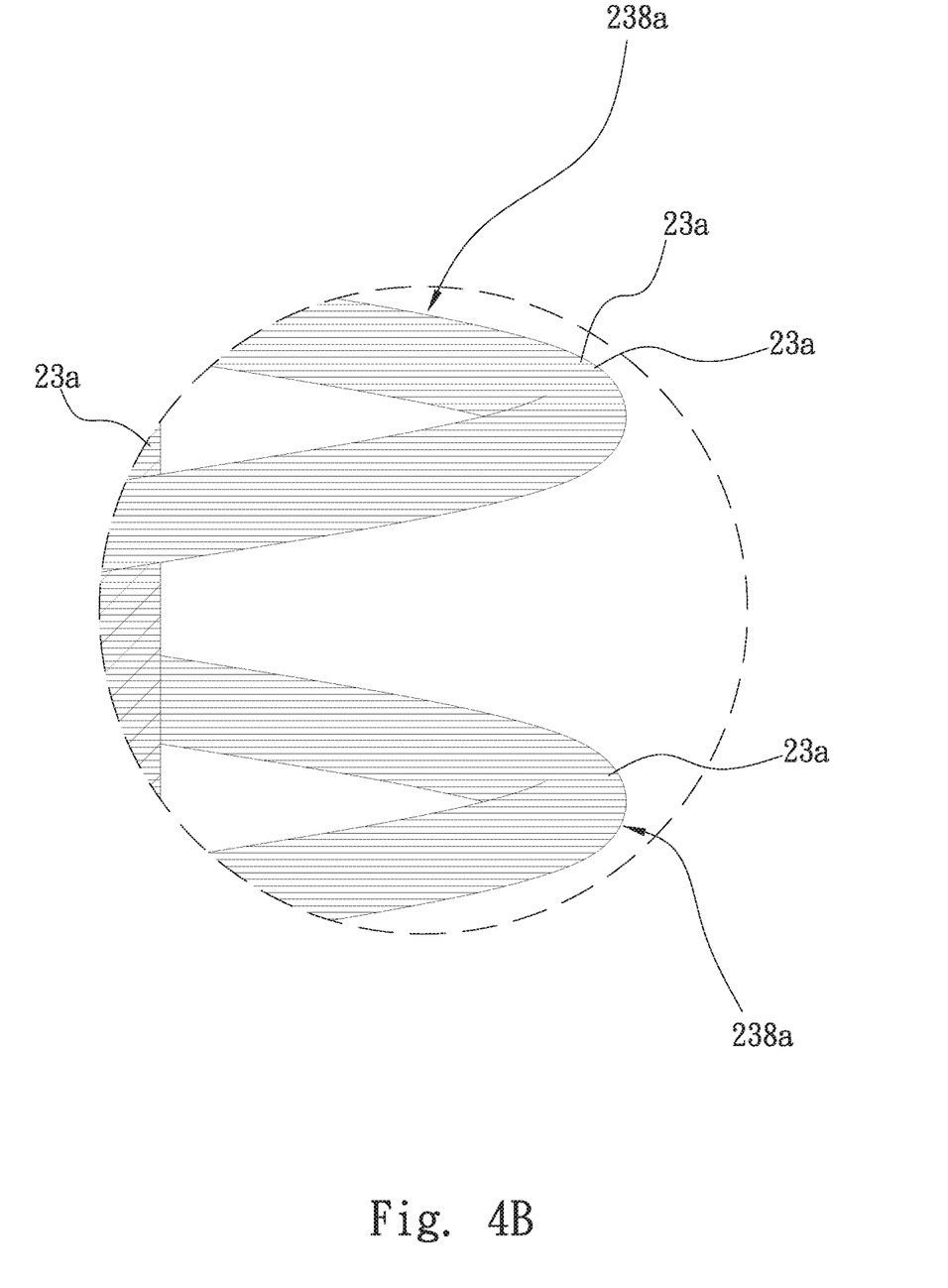
FIG. 4B is an enlarged view of the circled area of FIG. 4A.

Please refer to FIGS. 2, 3A and 3B along with FIGS. 2A, 2B and 2C, wherein FIG. 2 is an exploded perspective view of a water-cooling radiator assembly 2 according to an embodiment of the present invention, FIGS. 3A and 3B are assembled top and bottom perspective views of FIG. 2, respectively, and FIGS. 2A, 2B and 2C are enlarged views of circled areas 2A, 2B, 2C of FIG. 2, respectively. The water-cooling radiator assembly 2 in the illustrated embodiment includes at least one first sealing element 21, at least one second sealing element 22, a first coupling section 2391, a second coupling section 2392, and a plurality of radiator elements 23a. The radiator elements 23a are stacked to form a water-cooling radiator main body 23. In the illustrated embodiment, the radiator elements 23a are sheet members made of a metal material, such as copper, aluminum, stainless steel, magnesium-aluminum alloy, titanium, or other materials or composite materials with good ductility and malleability as well as good thermal conductivity. Each of the radiator elements 23a includes a slot 235a and a plurality of fins 237a. The fins 237a are outward extended from an outer periphery of each radiator element 23a for dissipating absorbed heat into ambient environment. The slot 235a penetrates each radiator element 23a in a thickness direction thereof and is located and extended on a specific part of the fins 237a. The slots 235a of the stacked radiator elements 23a together define a helical flow passage 238a in the water-cooling radiator main body 23, as shown in FIGS. 4A and 4B.

The first and the second sealing element 21, 22 and the radiator elements 23a are stacked and integrally connected to form the water-cooling radiator assembly 2. In other words, the second sealing element 22, the radiator elements 23a and the first sealing element 21 are sequentially stacked from bottom to top and then integrally connected together through heat treating to form the water-cooling radiator assembly 2. More specifically, the first and the second sealing element 21, 22 are respectively integrally connected at one side to an upper and a lower side of the water-cooling radiator main body 23 to seal a top and a bottom of the helical flow passage 238a. In the illustrated embodiment, the helical flow passage 238a is a non-tapered helical structure. As can be seen from FIGS. 2 and 4A, the slots 235a are provided on the radiator elements 23a along a helical line extending from bottom to top or from top to bottom, so that the slots 235a of the stacked and integrally connected radiator elements 23a together form the helical structure to define the helical flow passage 238a. In practical implementation of the present invention, the helical flow passage 238a can be optionally a tapered helical structure.

Further, the first coupling section 2391 is optionally provided on the first sealing element 21 or at a first end of the helical flow passage 238a; and the second coupling section 2392 is optionally provided on the second sealing element 22 or at an opposite second end of the helical flow passage 238a. In the illustrated embodiment, the first and the second coupling section 2391, 2392 are provided on the first and the second end, respectively, of the helical flow passage 238a. The first coupling section 2391 is used to guide a working fluid, such as pure water or other water-cooling liquid, into the helical flow passage 238a, and the working fluid finally leaves the helical flow passage 238a via the second coupling section 2392. That is, the first and second coupling sections 2391, 2392 are fluidly communicable with the helical flow passage 238a. In another operable embodiment, the first and the second coupling section 2391, 2392 are optionally provided on the first sealing element 21 and the second sealing element 22, respectively, to be fluidly communicable with the first and the second end of the helical flow passage 238a, respectively.

In the illustrated embodiment, the first sealing element 21 is a sheet member made of a metal material, such as copper, aluminum, stainless steel, magnesium-aluminum alloy, titanium, or other materials or composite materials with good ductility and malleability as well as good thermal conductivity. The first sealing element 21 has a first sealing section 213 and a plurality of first radiating fins 214. The first radiating fins 214 are outward extended from an outer periphery of the first sealing element 21. The first sealing section 213 is located and extended on a specific part of the first radiating fins 214 and has one side correspondingly connected to an upper side of the water-cooling radiator main body 23 to seal a top of the helical flow passage 238a. In the illustrated embodiment, the second sealing element 22 is a sheet member made of a metal material, such as copper, aluminum, stainless steel, magnesium-aluminum alloy, titanium, or other materials or composite materials with good ductility and malleability as well as good thermal conductivity. The second sealing element 22 has a second sealing section 223 and a plurality of second radiating fins 224. The second radiating fins 224 are outward extended from an outer periphery of the second sealing element 22. The second sealing section 223 is located and extended on a specific part of the second radiating fins 224 and has one side correspondingly connected to a lower side of the water-cooling radiator main body 23 to seal a bottom of the helical flow passage 238a.

In practical implementation of the present invention, the first and the second coupling section 2391, 2392 can be connected in a fluid communicable manner to an outlet and inlet, respectively, of a water block (not shown) via two tubes (not shown). The water block has one side serving as a heat-absorbing surface for contacting with a heat-producing element, such as a central processing unit (CPU) or a graphic processing unit (GPU), to absorb the produced heat. A working fluid in the water block absorbs the heat produced by the heat-producing element, and the heat-carrying working fluid is driven by a pump inside the water block or externally connected to the water block to flow through the first coupling section 2391 into the helical flow passage 238a in the water-cooling radiator main body 23. While the working fluid keeps flowing along the helical flow passage 238a downward to the second coupling section 2392, the heat absorbed by the working fluid is transferred to the fins 237a as well as the first and the second radiating fins 214, 224, from where the heat is dissipated into ambient environment by way of radiation. The working fluid is accordingly cooled and leaves the water-cooling radiator assembly 2 via the second coupling section 2392 to flow back into the water block. The working fluid continuously circulates between the water block and the water-cooling radiator assembly 2 to achieve the heat dissipation effect via water cooling.

Figure 5A:
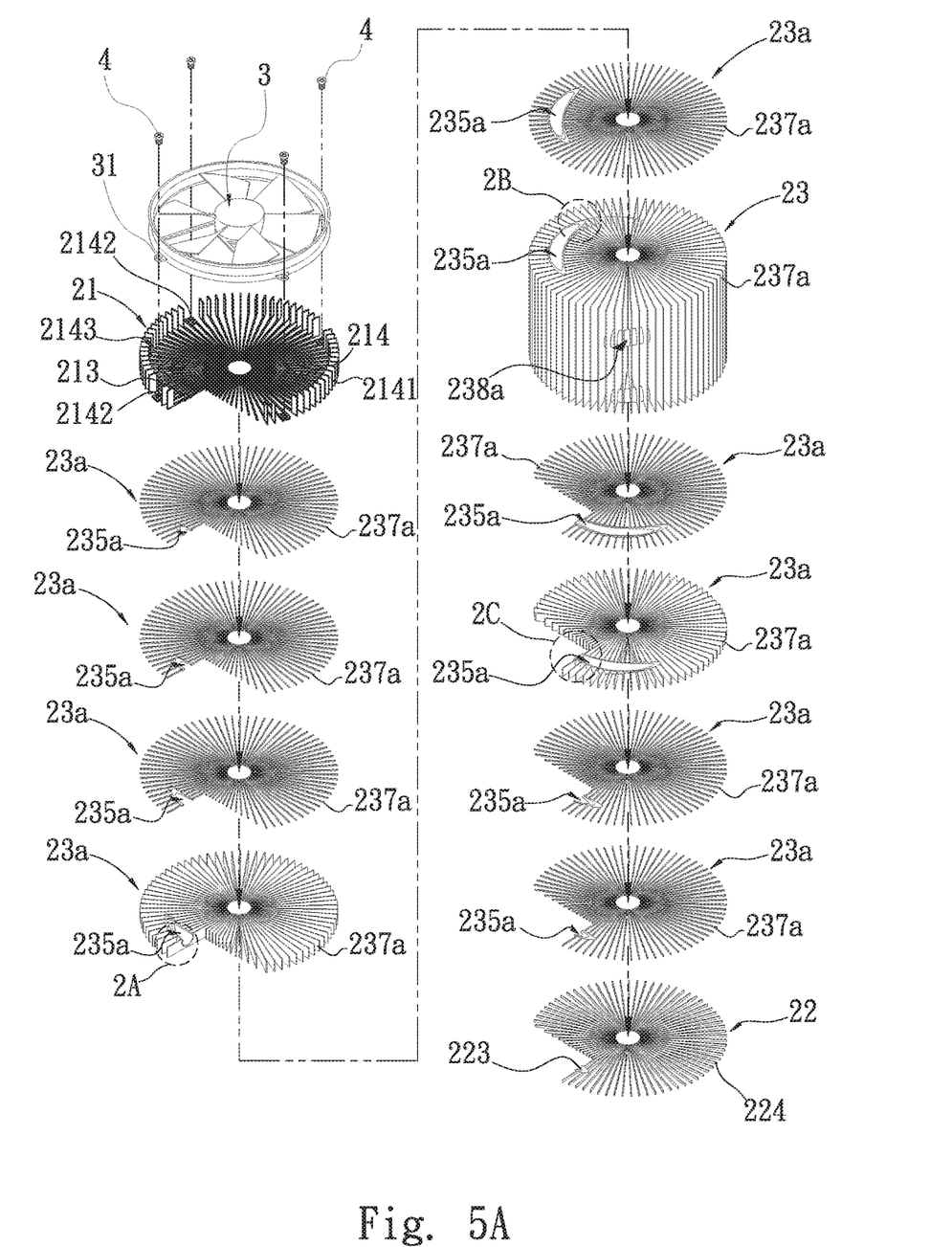
FIG. 5A is an exploded perspective view showing the water-cooling radiator assembly according to the present invention can have a fan connected thereto.
Figure 5B:
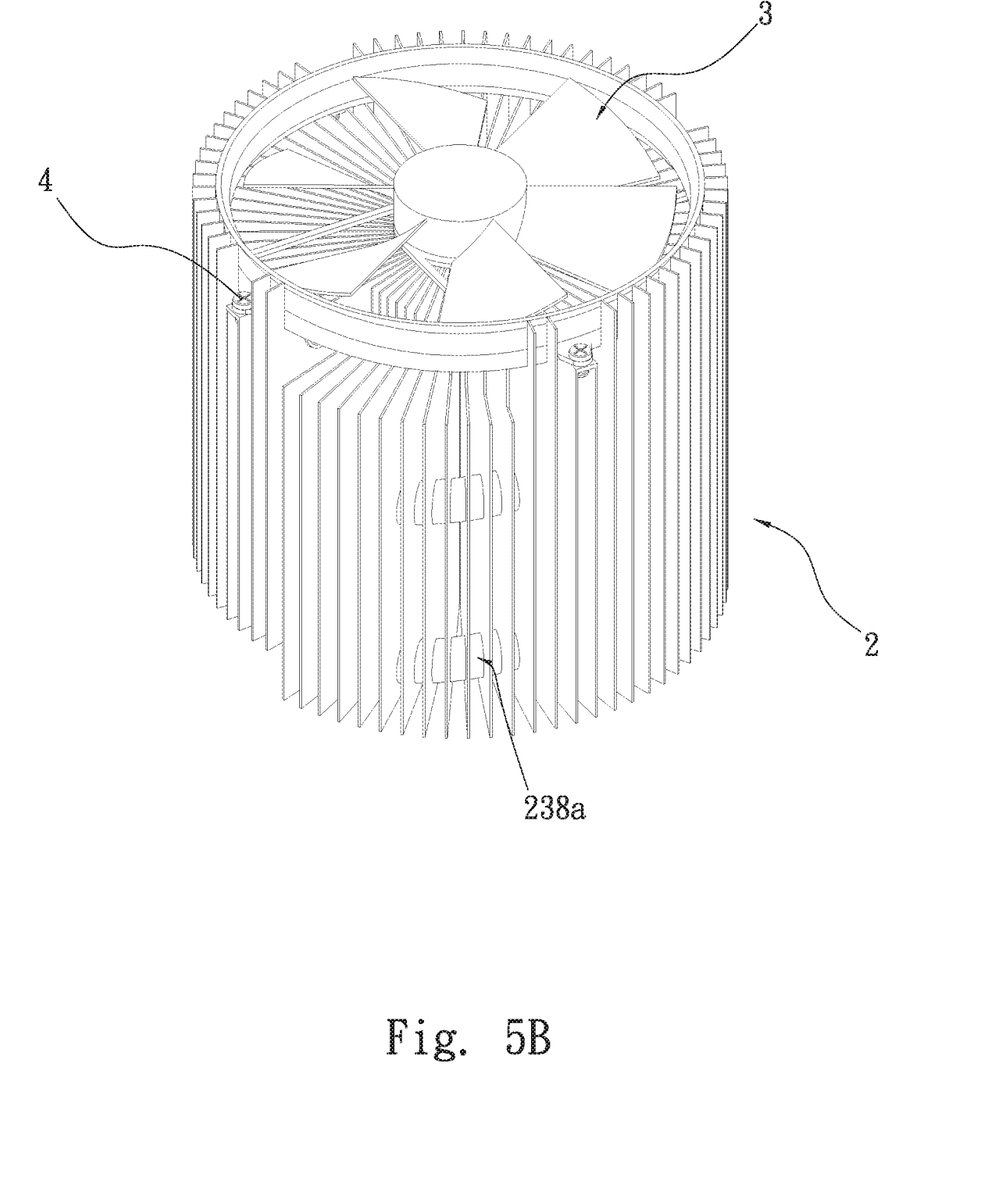
FIG. 5B is an assembled top perspective view of FIG. 5A.
Figure 5C:
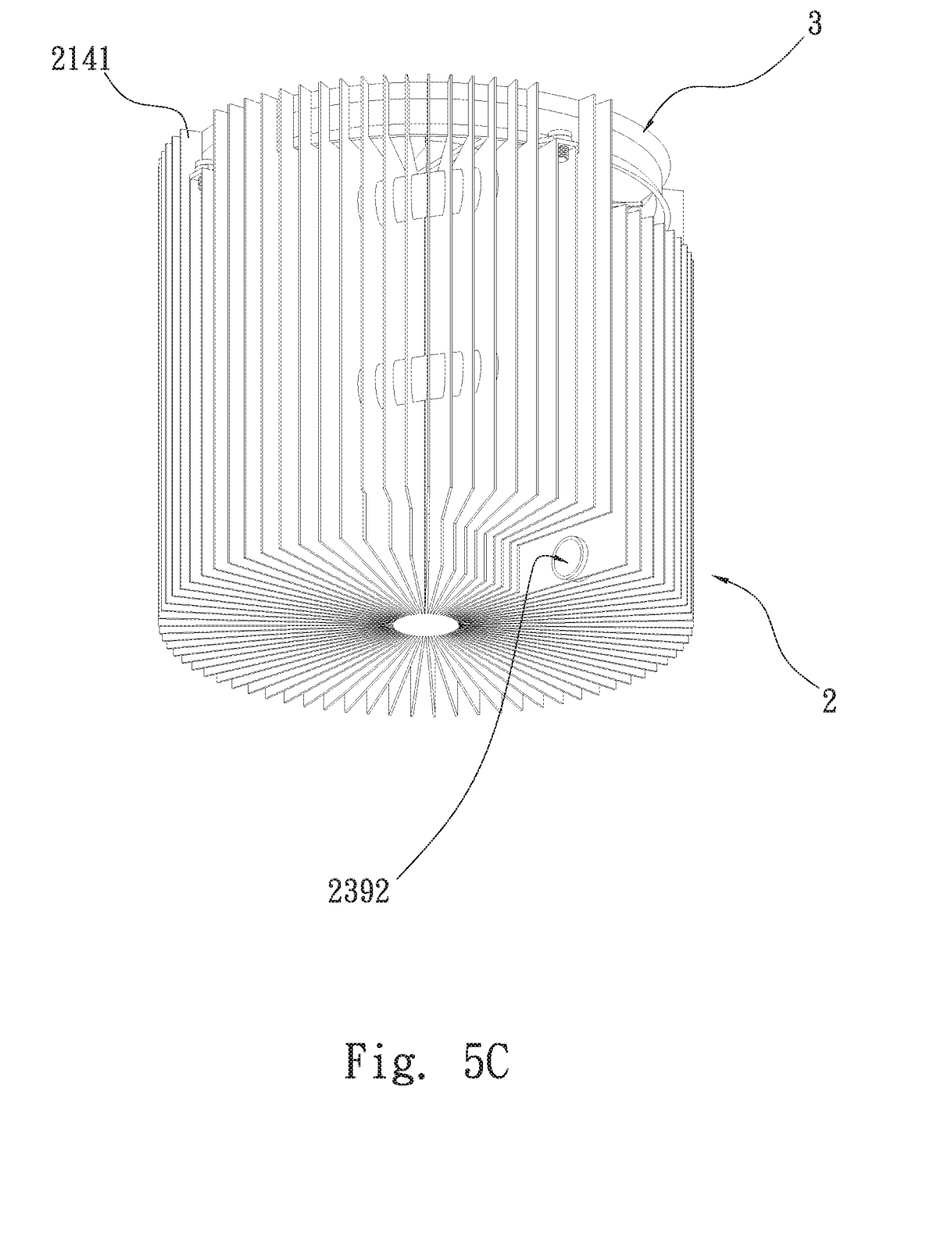
FIG. 5C is an assembled bottom perspective view of FIG. 5A.

FIG. 5A is an exploded perspective view showing the water-cooling radiator assembly 2 according to the present invention further has a fan connected thereto, and FIGS. 5B and 5C are assembled top and bottom perspective views, respectively, of the water-cooling radiator assembly 2 of FIG. 5A. Please refer to FIGS. 5A, 5B and 5C. According to an operable embodiment of the present invention, each of the first radiating fins 214 further includes an extended fin section 2141, which is upward extended from a radially outer end of the first radiating fin 214. The extended fin sections 2141 together define a receiving space 2143 for receiving a fan 3 therein to create forced dissipation of heat from the water-cooling radiator assembly 2. To mount the fan 3 in the receiving space 2143, a plurality of locking holes 2142 is further provided on the first radiating fins 214. Screws 4 are extended through a plurality of through holes 31 on the fan 3 into the locking holes 2142 to thereby secure the fan 3 to the first sealing element 21.

By forming the slot 235a and the fins 237a on each of the radiator elements 23a and forming the first and the second radiating fins 214, 224 on the first and the second sealing element 21, 22, respectively, it is possible for the heat carried by the working fluid to be transferred from each radiator element 23a directly to the fins 237a thereof as well as from the first and second sealing elements 21, 22 directly to the first and second radiating fins 214, 224, respectively. With these arrangements, largely increased heat transfer efficiency and excellent cooling efficiency can be effectively achieved. Further, by stacking and integrally connecting the first sealing element 21, the second sealing element 22 and the radiator elements 23a together, the water-cooling radiator assembly 2 of the present invention so formed can have changeful designs and effectively increased structural strength. Moreover, the provision of the helical flow passage 238a effectively increases the length of the flow passage in the water-cooling radiator assembly 2, so that the time over which the working fluid flows through the water-cooling radiator assembly 2 along the helical flow passage 238a is lengthened to enable even better heat dissipation effect.

The present invention has been described with some preferred embodiments thereof and it is understood that many changes and modifications in the described embodiments can be carried out without departing from the scope and the spirit of the invention that is intended to be limited only by the appended claims.

What is claimed is:
1. A liquid-cooling radiator assembly comprising:
a first sealing element having multiple first radiating fins outwardly radially extending from a central portion to an outer periphery of the first sealing element with a first plurality of the multiple first radiating fins each further including a locking hole configured to receive a screw and wherein a remaining second plurality of the multiple first radiating fins each further includes an extended fin section upwardly extending from a radially outer end of each of the second plurality of first radiating fins and the extended fin sections together defining a receiving space for receiving a fan therein;
a second sealing element;
a plurality of radiator elements stacked to form a liquid-cooling radiator main body and each of the radiator elements provided with fins and further having a slot which penetrates a respective radiator element in a thickness direction thereof such that the slots of the plurality of stacked radiator elements are stacked in a helical orientation so as to together define a helical cavity in the liquid-cooling radiator main body;
a helical flow passage defined by the helical cavity of the liquid-cooling radiator main body with a working fluid flowing therein, the first and the second sealing element each having one side connected to a first and a second ends, respectively, of the liquid-cooling radiator main body;
a first coupling section provided on the first sealing element or at a first end of the helical flow passage; and a second coupling section provided on the second sealing element or at a second end of the helical flow passage and the first and the second coupling section being fluidly communicable with the helical flow passage, wherein radiator elements adjacent the first and second sealing elements are notched to remove at least portions of the fins so as to provide clearance for the first and second coupling sections.

2. The liquid-cooling radiator assembly of claim 1, wherein the first sealing element has a first sealing section located and extended on the multiple first radiating fins and having one side connected to an upper side of the liquid-cooling radiator main body.

3. The liquid-cooling radiator assembly of claim 2, wherein the second sealing element has a second sealing section and a plurality of second radiating fins outwardly radially extending from a central portion to an outer periphery of the second sealing element, wherein the second sealing section is located and extended on the second radiating fins and wherein the second sealing section has one side connected to a lower side of the liquid-cooling radiator main body.

4. The liquid-cooling radiator assembly of claim 1, wherein the first and the second coupling sections are provided at and in fluid communication with the first and the second ends, respectively, of the helical flow passage.

5. The liquid-cooling radiator assembly of claim 1, wherein the first and the second sealing elements and the radiator elements are sheet members made of a metal material and the second sealing element, the radiator elements and the first sealing element are sequentially stacked from bottom to top and then integrally connected together through heat treating to form the liquid-cooling radiator assembly.

* * * * *